(12) United States Patent
Wada et al.

(10) Patent No.: US 10,295,852 B2
(45) Date of Patent: May 21, 2019

(54) OPTICAL DEVICE AND METHOD FOR MANUFACTURING OPTICAL DEVICE

(71) Applicant: FUJIKURA LTD., Tokyo (JP)

(72) Inventors: Hideyuki Wada, Chiba (JP); Shinichi Sakamoto, Chiba (JP); Kohei Matsumaru, Chiba (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 15/552,422

(22) PCT Filed: Mar. 23, 2016

(86) PCT No.: PCT/JP2016/059243
§ 371 (c)(1),
(2) Date: Aug. 21, 2017

(87) PCT Pub. No.: WO2016/170903
PCT Pub. Date: Oct. 27, 2016

(65) Prior Publication Data
US 2018/0045990 A1    Feb. 15, 2018

(30) Foreign Application Priority Data

Apr. 23, 2015  (JP) ................. 2015-088667

(51) Int. Cl.
*G02B 5/20* (2006.01)
*G02F 1/31* (2006.01)
(Continued)

(52) U.S. Cl.
CPC ........... *G02F 1/1333* (2013.01); *G02B 5/201* (2013.01); *G02B 26/085* (2013.01);
(Continued)

(58) Field of Classification Search
CPC ..................... G02F 1/1333; G02F 1/31; G02F 2001/136281; G02F 2001/305;
(Continued)

(56) References Cited

U.S. PATENT DOCUMENTS 5,097,318 A    3/1992  Tanaka et al.
6,295,154 B1 *  9/2001  Laor .................... G02B 6/3512
                                                       359/223.1
(Continued)

FOREIGN PATENT DOCUMENTS

JP     H01-253942 A    10/1989
JP     2003-017797 A    1/2003
(Continued)

OTHER PUBLICATIONS

Japanese Office Action issued in corresponding application No. 2015-088667 dated Jan. 10, 2017 (1 page).
(Continued)

*Primary Examiner* — Collin X Beatty
(74) *Attorney, Agent, or Firm* — Osha Liang LLP (57) ABSTRACT

An optical device includes a window glass plate with which a window of a lid section is provided and which is connected to the lid section via a solder layer so that an internal space of the optical device is hermetically sealed. The solder layer has a void which is isolated from an external space and an internal space of the optical device.

7 Claims, 7 Drawing Sheets

(51) Int. Cl.
    *G02F 1/1333*     (2006.01)
    *G02F 1/1362*     (2006.01)
    *G03B 21/00*     (2006.01)
    *G02B 26/08*     (2006.01)
    *H01L 23/02*     (2006.01)

(52) U.S. Cl.
    CPC ........... *G02B 26/0875* (2013.01); *G02F 1/31* (2013.01); *G03B 21/005* (2013.01); *H01L 23/02* (2013.01); *G02F 2001/136281* (2013.01); *G02F 2201/305* (2013.01)

(58) Field of Classification Search
    CPC .. G02B 5/201; G02B 26/085; G02B 26/0875; G03B 21/005; H01L 23/02; H01L 23/06; H01L 23/10
    USPC .......................................................... 359/586
    See application file for complete search history.

(56) References Cited

U.S. PATENT DOCUMENTS

| | | | |
|---|---|---|---|
| 6,671,449 B1* | 12/2003 | Yuan | H01S 5/02 385/135 |
| 6,989,921 B2* | 1/2006 | Bernstein | B81B 3/0062 359/224.1 |
| 7,211,934 B2* | 5/2007 | Fujiwara | B81B 7/007 310/313 R |
| 7,710,629 B2* | 5/2010 | Palmateer | B81B 3/007 257/682 |
| 9,056,764 B2* | 6/2015 | Tarn | B81C 1/00269 |
| 2004/0232535 A1 | 11/2004 | Tarn | |
| 2004/0238600 A1 | 12/2004 | Tarn | |
| 2005/0099671 A1* | 5/2005 | Matsuo | G02B 26/085 359/291 |
| 2005/0157374 A1 | 7/2005 | Tarn | |
| 2005/0185248 A1 | 8/2005 | Tarn | |
| 2009/0072380 A1 | 3/2009 | Tarn | |
| 2010/0059244 A1* | 3/2010 | Ishii | B81C 1/00269 174/50.5 |
| 2012/0074554 A1* | 3/2012 | Cheng | B81C 1/00269 257/684 |
| 2012/0180949 A1 | 7/2012 | Tarn | |
| 2015/0287354 A1* | 10/2015 | Wang | G09G 3/2051 345/598 |
| 2018/0090405 A1* | 3/2018 | Yamamoto | H01L 23/02 |

FOREIGN PATENT DOCUMENTS

| | | |
|---|---|---|
| JP | 2007-524112 A | 8/2007 |
| JP | 2008-288497 A | 11/2008 |
| JP | 2009-069676 A | 4/2009 |
| JP | 2011-187739 A | 9/2011 |
| JP | 2014-168836 A | 9/2014 |

OTHER PUBLICATIONS

Japanese Office Action issued in corresponding application No. 2015-088667 dated Jun. 21, 2016 (2 pages).

* cited by examiner

OPTICAL DEVICE AND METHOD FOR MANUFACTURING OPTICAL DEVICE

TECHNICAL FIELD

One or more embodiments of the present invention relate to (i) an optical device in which an optical element is sealed and (ii) a method of producing such an optical device.

BACKGROUND

Conventionally, there has been known an optical device in which an optical element is hermetically sealed so as to suppress an influence of humidity or the like on the optical element.

For example, Patent Literature 1 discloses a configuration in which an MEMS mirror is hermetically sealed. According to the configuration, in a state where the MEMS mirror which serves as an optical element is provided in a casing, the casing and a lid are connected to each other by a connecting material made of resin.

Patent Literature 2 also discloses a configuration in which a micro-mirror array device is hermetically sealed. According to the configuration, in a state where the micro-mirror array device which serves as an optical element is provided in a package substrate, the package substrate is soldered to a cover substrate via a sealing medium layer.

CITATION LIST

Patent Literature

[Patent Literature 1]
Japanese Patent Application Publication Tokukai No. 2014-168836 (Publication date: Sep. 18, 2014)
[Patent Literature 2]
Japanese Patent Application Publication Tokuhyo No. 2007-524112 (Publication date: Aug. 23, 2007)

SUMMARY

According to Patent Literature 1, resin is used as a connecting material for hermetically sealing an optical element. This makes it impossible to protect the optical element while maintaining high airtightness, because resin has a hygroscopic property. In contrast, according to Patent Literature 2, a solder is used as a connecting material for hermetically sealing the optical element. This makes it possible to hermetically seal the optical element while maintaining high airtightness.

However, in a case where a mere solder is used as a connecting member, a change in temperature of an external space is easier to be conducted to an internal space of a package because the solder has a high thermal conductivity. This causes the optical element to be easy to change its characteristic in response to a change in temperature of the external space. It is therefore difficult for the optical device to operate stably.

One or more embodiments of the present invention may provide (i) an optical device which is hard to be affected by a change in temperature of an external space and (ii) a method of producing such an optical device.

An optical device in accordance with an aspect of one or more embodiments of the present invention may include: a housing section configured to have a window; an optical element which is provided in the housing section and which light enters via the window; a window glass plate with which the window is provided; and a connecting section configured to connect the window glass plate to the housing section so that an internal space of the housing section is hermetically sealed, the connecting section being formed of a solder layer, the solder layer having therein a void which is isolated from an external space and the internal space of the optical device.

Advantageous Effects of Invention

According to an aspect of one or more embodiments of the present invention, the optical device is hard to be affected by a change in temperature of an external space and can therefore operate stably.

BRIEF DESCRIPTION OF DRAWINGS

(a) of FIG. 5 is a plan view illustrating the window glass plate illustrated in FIG. 4. (b) of FIG. 5 is a plan view illustrating a solder frame which is used to form the solder layer illustrated in FIG. 4. (c) of FIG. 5 is a longitudinal sectional view illustrating how the solder frame is provided between the lid section and the window glass plate illustrated in FIG. 4. (d) of FIG. 5 is a longitudinal sectional view illustrating how the lid section and the window glass plate are connected via the solder layer formed from the solder frame.

(a) of FIG. 6 is a plan view illustrating the window glass plate, illustrated in FIG. 4, which is used in a method of producing an optical device in accordance with another one or more embodiments of the present invention. (b) of FIG. 6 is a plan view illustrating a solder frame which is used to form the solder layer illustrated in FIG. 4. (c) of FIG. 6 is a longitudinal sectional view illustrating how the solder frame is provided between the lid section and the window glass plate illustrated in FIG. 4. (d) of FIG. 6 is a longitudinal sectional view illustrating how the lid section and the window glass plate are connected via the solder layer formed from the solder frame.

(a) of FIG. 7 is a plan view illustrating the window glass plate, illustrated in FIG. 4, which is used in a method of producing an optical device in accordance with still another one or more embodiments of the present invention. (b) of FIG. 7 is a plan view illustrating a solder frame which is used to form the solder layer illustrated in FIG. 5. (c) of FIG. 7 is a longitudinal sectional view illustrating how the solder frame is provided between the lid section and the window glass plate illustrated in FIG. 4. (d) of FIG. 7 is a longitudinal sectional view illustrating how the lid section and the window glass plate are connected via the solder layer formed from the solder frame.

DESCRIPTION OF EMBODIMENTS

Figure 1:
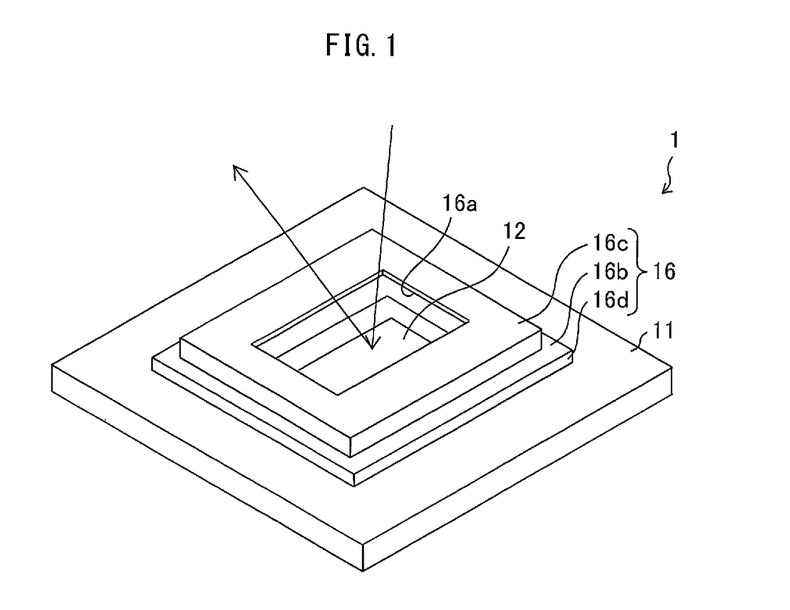
FIG. 1 is a perspective view illustrating an optical device in accordance with one or more embodiments of the present invention.

The following description will discuss one or more embodiments of the present invention with reference to the drawings. FIG. 1 is a perspective view illustrating an optical device 1 in accordance with one or more embodiments of the present invention. The optical device 1 in accordance with one or more embodiments is a hermetic liquid-crystal-on-silicon (LCOS) package which includes an LCOS serving as an optical element 12.

(Appearance and Function of Optical Device 1)

As illustrated in FIG. 1, the optical device 1 further includes (i) a ceramic substrate 11 on which the optical element 12 is provided and (ii) a lid section 16 for sealing the optical element 12. With the configuration, light, which has entered a window 16a of the lid section 16, is reflected by the optical element 12. The optical element 12 includes a liquid crystal layer which serves as a diffraction grating which is changed in accordance with a voltage to be applied across the optical element 12. This causes a change in reflection angle of the light. Specifically, in a case where light (optical signal), which is emitted from an optical fiber and is then subjected to wavelength-division multiplexing, is collimated and enters the optical element 12, the optical element 12 controls reflection angles of the light thus multiplexed in accordance with wavelengths so that the light, having respective reflection angles, enters optical fibers corresponding to respective wavelength channels.

(Configuration of Optical Device 1)

Figure 2:
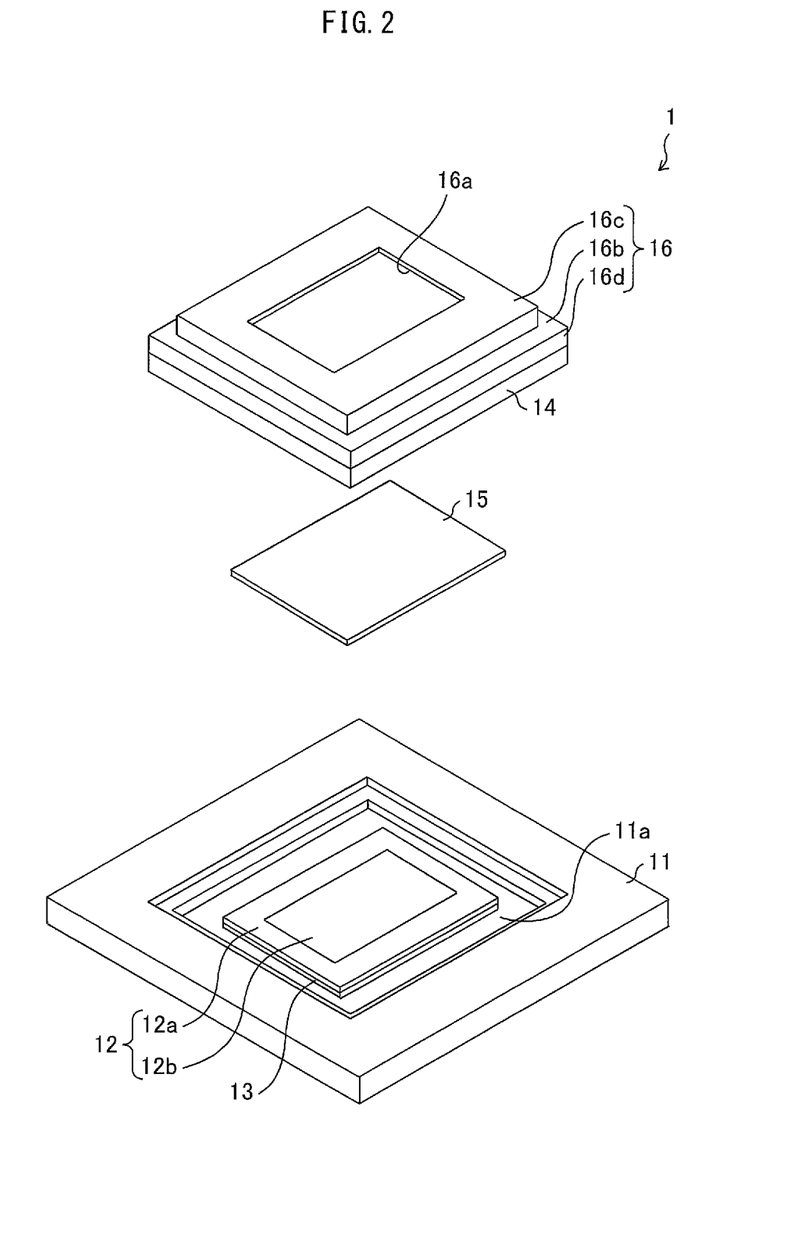
FIG. 2 is an exploded perspective view illustrating parts of the optical device illustrated in FIG. 1.
Figure 3:
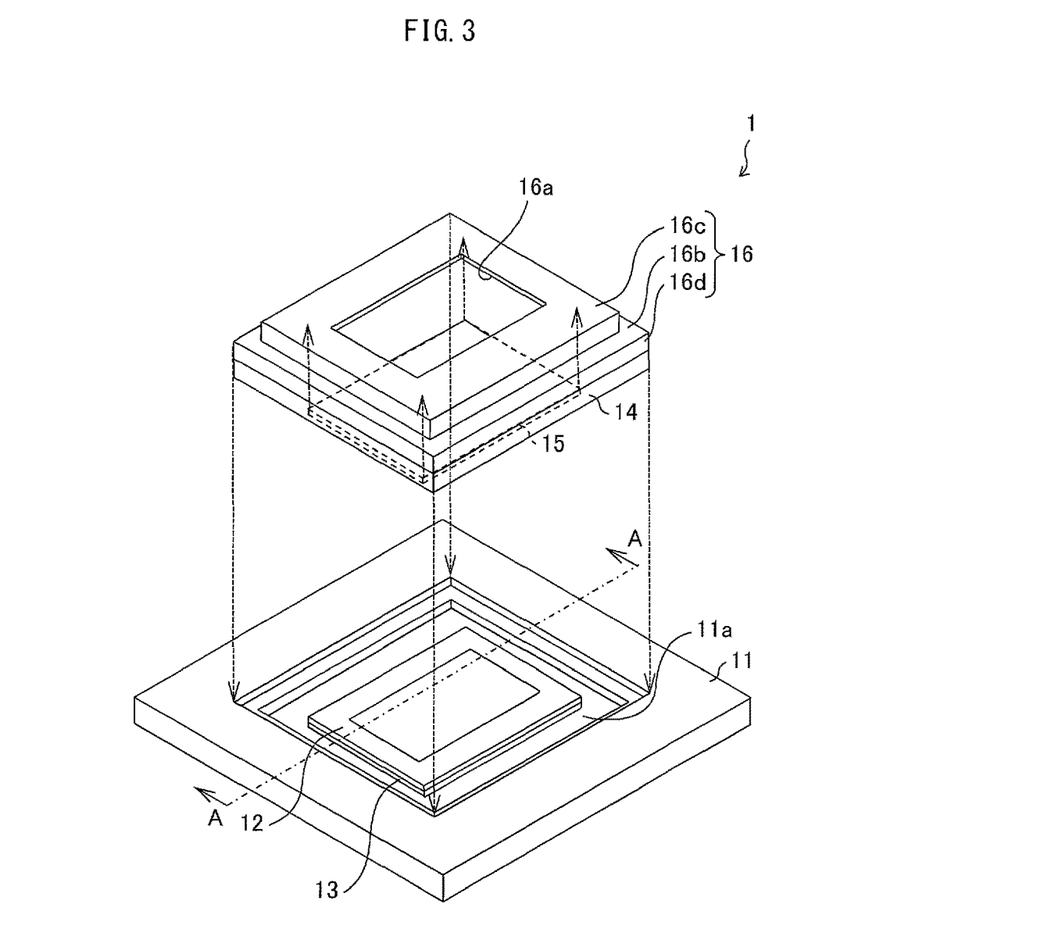
FIG. 3 is an exploded perspective view illustrating how the respective parts of the optical device illustrated in FIG. 1 are related to each other in terms of their respective locations.
Figure 4:
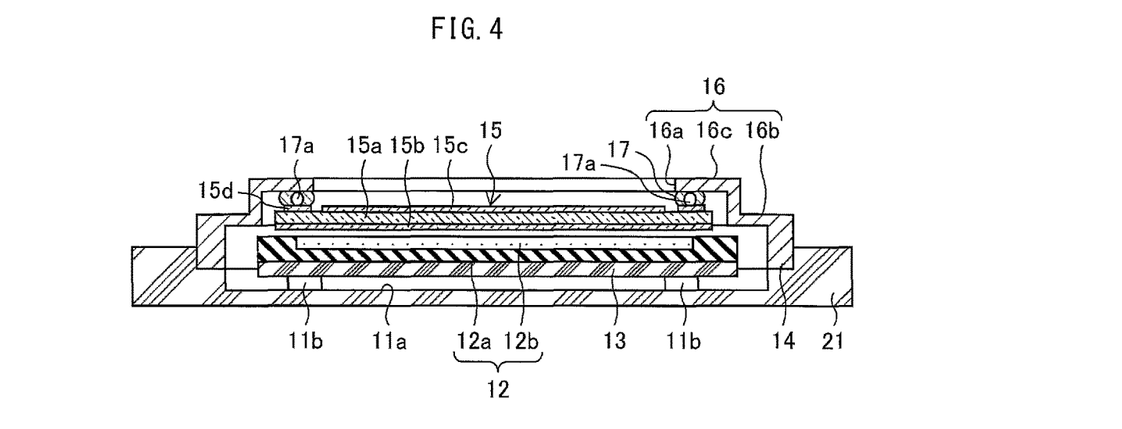
FIG. 4 is a cross-sectional view taken along the line A-A shown in FIG. 3.

FIG. 2 is an exploded perspective view illustrating parts of the optical device 1 illustrated in FIG. 1. FIG. 3 is an exploded perspective view illustrating how the respective parts of the optical device 1 in FIG. 1 are related to each other in terms of their respective locations. FIG. 4 is a cross-sectional view taken along the line A-A shown in FIG. 3.

As illustrated in FIGS. 2 through 4, the optical device 1 includes the ceramic substrate (housing section, second housing section) 11, the optical element 12, a heater 13, a window glass plate 15, and the lid section (housing section, first housing section) 16.

The ceramic substrate 11 is made of, for example, alumina ceramic, and has, on its top surface, a recess 11a in which the optical element 12 is to be provided and which partially has a leg part 11b (see FIG. 4) on which the optical element 12 is to be placed.

The optical element 12 includes a silicon substrate 12a and a liquid crystal layer 12b. The diffraction grating is formed on the liquid crystal layer 12b. The diffraction grating is configured to change a reflection angle of incident light in accordance with a voltage applied across the optical element 12. The heater 13 is realized by including, in an alumina ceramic material, a heating circuit (not illustrated) and a temperature control circuit (not illustrated). The heater 13 is provided on a lower part of the optical element 12. Each of the optical element 12 and the heater 13 is connected to a connection terminal (not illustrated) by, for example, wire bonding.

The lid section 16, provided on the ceramic substrate 11, has an outer peripheral part 16b, a protruding part 16c, and a sealing frame part 16d. The protruding part 16c is provided so as to protrude, by one-stage, upwards from an inner part of the outer peripheral part 16b. The protruding part 16c has the foregoing window 16a. The sealing frame part 16d is provided underneath the outer peripheral part 16b so as to have a quadrilateral frame shape. The sealing frame part 16d is located on the ceramic substrate 11 so as to surround the recess 11a of the ceramic substrate 11.

The lid section 16 is made of, for example, Kovar (registered trademark) which is an alloy obtained by mixing nickel and cobalt with iron. Kovar (registered trademark) is similar in properties to a hard glass because it has, among various metals, a low thermal expansion coefficient at around normal temperatures.

The window glass plate 15 includes a light-translucent base material 15a made of, for example, Kovar (registered trademark) glass. The light-translucent base material 15a has (i) a bottom surface on which an anti-reflection film 15b is provided and (ii) a top surface on which an anti-reflection film 15c and a metal coating film 15d are provided. The anti-reflection film 15b is provided on an entire part of the bottom surface of the light-translucent base material 15a. The anti-reflection film 15c is provided on the top surface of the window glass plate 15, except an outer peripheral part of the top surface. The metal coating film 15d is provided, in an annular shape, on the outer peripheral part of the window glass plate 15. The metal coating film 15d has a three-layer structure in which a chromium layer, a nickel layer, and a gold layer are stacked in this order from a side on which the light-translucent base material 15a is provided.

The solder layer 17 is provided, in an annular shape, between (i) the top surface of the metal coating film 15d of the window glass plate 15 and (ii) a part of the bottom surface of the protruding part 16c of the lid section 16, which part surrounds the window 16a. The lid section 16 and the window glass plate 15 are connected via the solder layer 17. The solder layer 17 is made of, for example, an alloy of gold and tin, and has therein a void 17a.

The void 17a is isolated from and independent of an external space and an internal space of the optical device 1. In the void 17a, a gas, i.e., air or nitrogen, is present. The solder layer 17 can have therein a plurality of voids 17a. Such a plurality of voids 17a can be irregular in size, and may be scattered in the solder layer 17. Though the plurality of voids 17a may be scattered, it is sufficient that the solder layer 17 has at least one void 17a.

The optical device 1 is thus configured so that the internal space of the optical device 1 is hermetically sealed, that is, isolated from a space (i.e., external space) outside the optical device 1. The internal space is surrounded by (i) the ceramic substrate 11, (ii) the lid section 16, (iii) the solder layer 17, and (iv) the window glass plate 15. This causes the optical element 12, which is present in the internal space of the optical device 1, to be kept hermetically sealed. The internal space of the optical device 1 is also filled with at least one of helium gas and nitrogen gas, in a state where the at least one of helium gas and nitrogen gas has a pressure greater than an external pressure.

(Method of Producing Optical Device 1)

Figure 5:
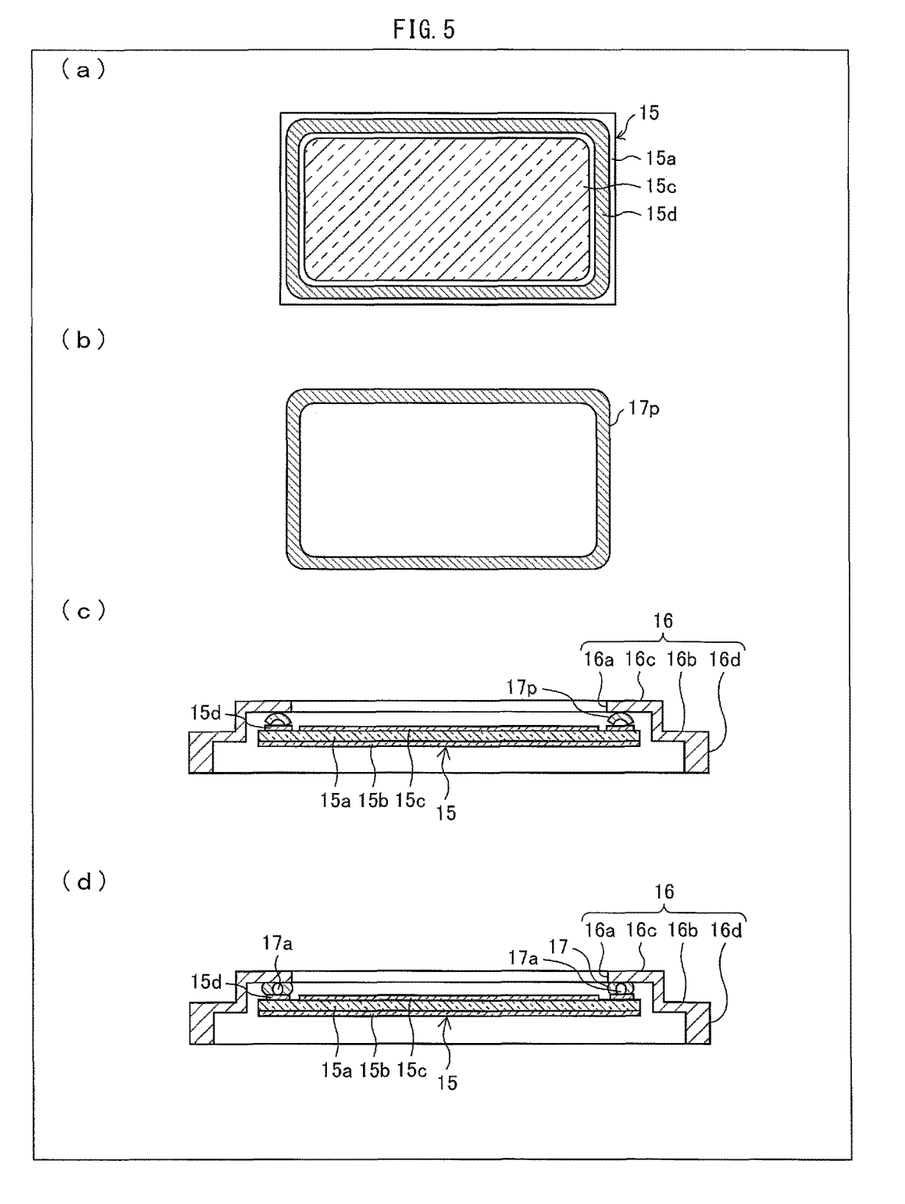

The following description will discuss a method of producing the optical device 1 configured as discussed above. (a) of FIG. 5 is a plan view illustrating the window glass plate 15 illustrated in FIG. 4. (b) of FIG. 5 is a plan view illustrating a solder frame 17p which is used to form the solder layer 17 illustrated in FIG. 4. (c) of FIG. 5 is a longitudinal sectional view illustrating how the solder frame 17p is provided between the lid section 16 and the window glass plate 15. (d) of FIG. 5 is a longitudinal sectional view illustrating how the lid section 16 and the window glass plate 15 are connected via the solder layer 17 formed from the solder frame 17p.

Prior to production of the optical device 1, the following members are prepared: (i) the lid section 16, (ii) the window glass plate 15 (see (a) of FIG. 5), (iii) the solder frame 17p which is used to connect the lid section 16 and the window glass plate 15 (see (b) of FIG. 5), (iv) the ceramic substrate 11, (v) the optical element 12, and (vi) the heater 13. The heater 13 is to be attached in advance to the bottom surface of the optical element 12 with the use of an adhesive.

The solder frame 17p has a quadrilateral frame shape (see (b) of FIG. 5). The solder frame 17p has a dimension which scales with that of the metal coating film 15d of the window glass plate 15, i.e., has a dimension which is substantially identical to that of the metal coating film 15d. The solder frame 17p is obtained by, for example, cutting out a piece from a plate-like solder with the use of dies cutting. The solder frame 17p has a cross section which is curved in, for example, a U-shape (see (c) of FIG. 5).

In the step of producing the optical device 1, the lid section 16 and the window glass plate 15 are first connected. In this step, the solder frame 17p is provided on the metal coating film 15d of the window glass plate 15, and then the lid section 16 is provided on the solder frame 17p (see (c) of FIG. 5). Note that, according to (c) of FIG. 5, the solder frame 17p is provided on the metal coating film 15d so that its curved part protrudes upwards. Embodiment 1 is, however, not limited as such. Alternatively, the solder frame 17p can be provided on the metal coating film 15d so that its curved part protrudes downwards.

Then, in a state illustrated in (c) of FIG. 5, the lid section 16, the window glass plate 15, and the solder frame 17p are heated up to the melting temperature of the solder frame 17p. This step is carried out by, for example, reflow-soldering. The solder frame 17p starts melting from its outer peripheral part. Note that the heating is carried out, at normal pressures, in an air atmosphere or in a nitrogen atmosphere.

Then, as melting of the solder frame 17p proceeds, the metal coating film 15d of the window glass plate 15 and a bottom surface of the lid section 16 get wet with solder of the solder frame 17p. This causes the window glass plate 15 and the lid section 16 to be connected (see (d) of FIG. 5). The air atmosphere or the nitrogen atmosphere is consequently confined within the solder layer 17 which is formed from the solder frame 17p, so that the solder layer 17 has therein the void 17a.

After that, the optical element 12 and the heater 13, which have been connected in advance, are arranged on and fixed to the leg part 11b of the recess 11a of the ceramic substrate 11 with use of an adhesive.

Lastly, the lid section 16, to which the window glass plate 15 is connected, and the ceramic substrate 11 are brazed with a brazing filler metal at normal pressure and in at least one of a helium atmosphere or a nitrogen atmosphere.

(Study on Void 17a of Solder Layer 17)

Note that (i) the solder layer 17 made of Au—Sn solder has a thermal conductivity of 57 W/mK and (ii) air and nitrogen have thermal conductivities of 0.024 W/mK and 0.026 W/mK, respectively. The solder layer 17 can reduce its thermal conductivity by 43%, in a case where a ratio of a volume of the void 17a made of air or nitrogen to a volume of the solder layer 17 is, for example, 1/3. This allows the solder layer 17 to secure a thermal insulation property. In view of the circumstances, it is possible that a ratio of a volume of the void 17a to a volume of the solder layer 17 is set so as to fall within the range of 1/4 to 1/2.

A thermal capacity (for example, thermal insulation property) of the solder layer 17 can also be secured by increasing an area of the solder layer 17, instead of forming the void 17a. In such a case, however, in order to obtain a thermal insulation property, it may be necessary to increase, by approximately 40 times, a sealing width (forming width) of the solder layer 17 made of Au—Sn solder. For example, in a case of the sealing width of 1 mm which is assumed in the optical device 1 in accordance with Embodiment 1, it is necessary to configure the optical device 1 so that the sealing width is increased to 40 mm. Such a configuration cannot be employed in view of reducing (i) sizes of respective members constituting the optical device 1 and (ii) the number of members constituting the optical device 1. Note that the solder layer 17 of the optical device 1 in accordance with Embodiment 1 can have a sealing width which falls within the range of 0.5 mm to 1 mm.

(Advantage of Optical Device 1)

As has been discussed, the optical device 1 is configured such that the lid section 16 and the window glass plate 15 are connected via the solder layer 17. This prevents moisture contained in outside air from coming into the optical device 1 from a space between the lid section 16 and the window glass plate 15. It is therefore possible to protect the optical element 12 while maintaining high airtightness.

Furthermore, the solder layer 17 has the void 17a within which air or nitrogen is confined, i.e., the void 17a which is isolated from the external space and the internal space of the optical device 1. The void 17a serves as a thermal-conduction-moderating layer which moderates the high thermal conductivity of the solder layer 17. This makes it difficult for a change in temperature of the external space to be conducted to the optical element 12 included in the optical device 1. Consequently, the optical element 12 is hard to change its characteristic even in a case where the temperature of the external space changes. As such, the optical device 1 is hard to be affected by a change in external environment. The optical device 1 can therefore operate continuously and stably.

Embodiment 2

The following description will discuss one or more embodiments of the present invention with reference to the drawings.

(Method of Producing Optical Device 1)

Figure 6:
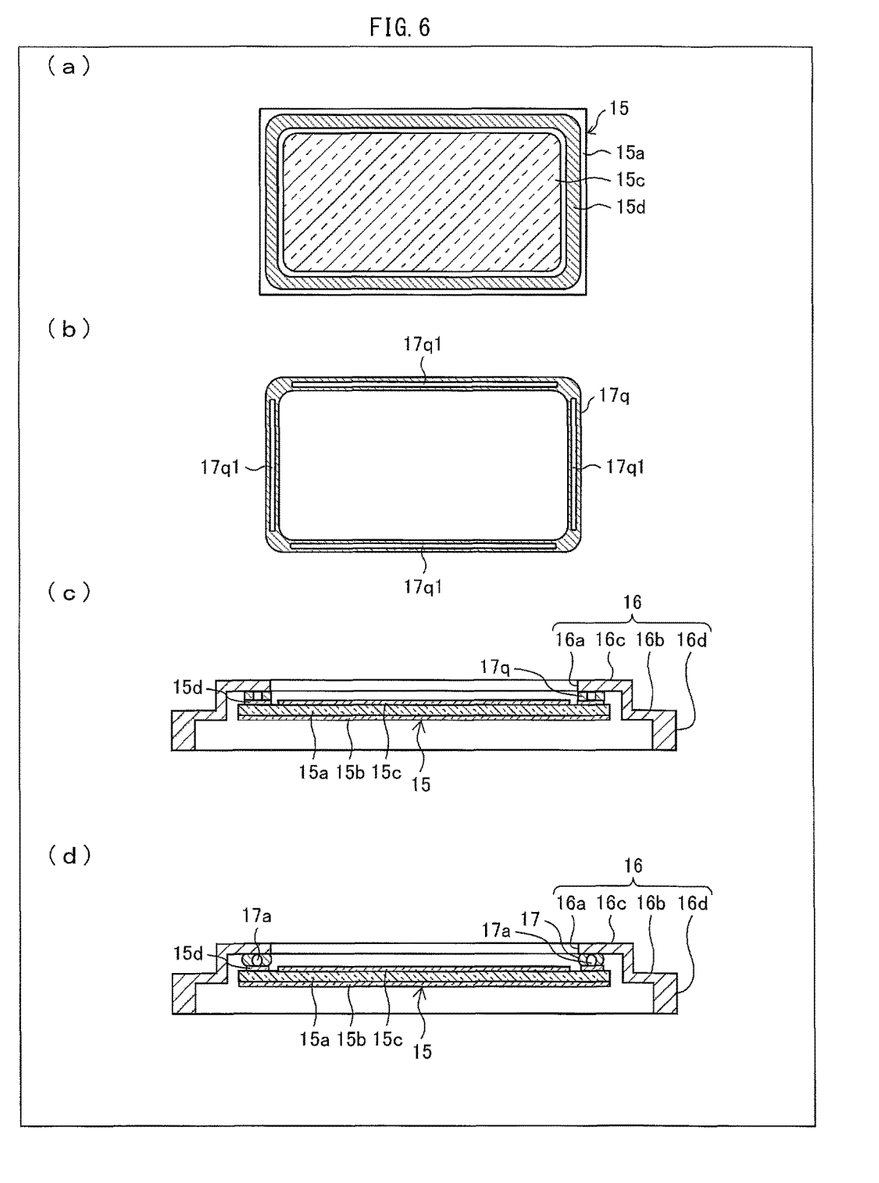

(a) of FIG. 6 is a plan view illustrating the window glass plate 15, illustrated in FIG. 4, which is used in a method of producing an optical device 1 in accordance with Embodiment 2. (b) of FIG. 6 is a plan view illustrating a solder frame 17q which is used to form the solder layer 17 illustrated in FIG. 4. (c) of FIG. 6 is a longitudinal sectional view illustrating how the solder frame 17q is provided between a lid section 16 and a window glass plate 15. (d) of FIG. 6 is a longitudinal sectional view illustrating how the lid section 16 and the window glass plate 15 are connected via a solder layer 17 formed from the solder frame 17q.

According to the method of producing the optical device 1 in accordance with Embodiment 2, the solder frame 17q illustrated in (b) of FIG. 6 is employed instead of the solder frame 17p illustrated in (b) of FIG. 5. The solder frame 17p has four sides each of which has, in its center in a width direction, a slit 17q1 which extends along the each of the four sides. Note, however, that the slit 17q1 is not provided at corners of the solder frame 17p.

According to the method in accordance with Embodiment 2, the solder frame 17q having the slits 17q1 is employed in the step of connecting the lid section 16 and the window glass plate 15. This makes it easier for a void 17a to be formed in the solder layer 17 in a case where the solder frame 17q is melted so as to form the solder layer 17. It is therefore possible to securely form the void 17a in the solder layer 17.

The other configurations with regard to the method of producing the optical device 1, configurations of the optical device 1 produced by the method, and advantages of the optical device 1 are similar to those discussed in Embodiment 1 with reference to FIGS. 1 through 5.

Embodiment 3

The following description will discuss one or more embodiments of the present invention with reference to the drawings.

(Method of Producing Optical Device 1)

Figure 7:
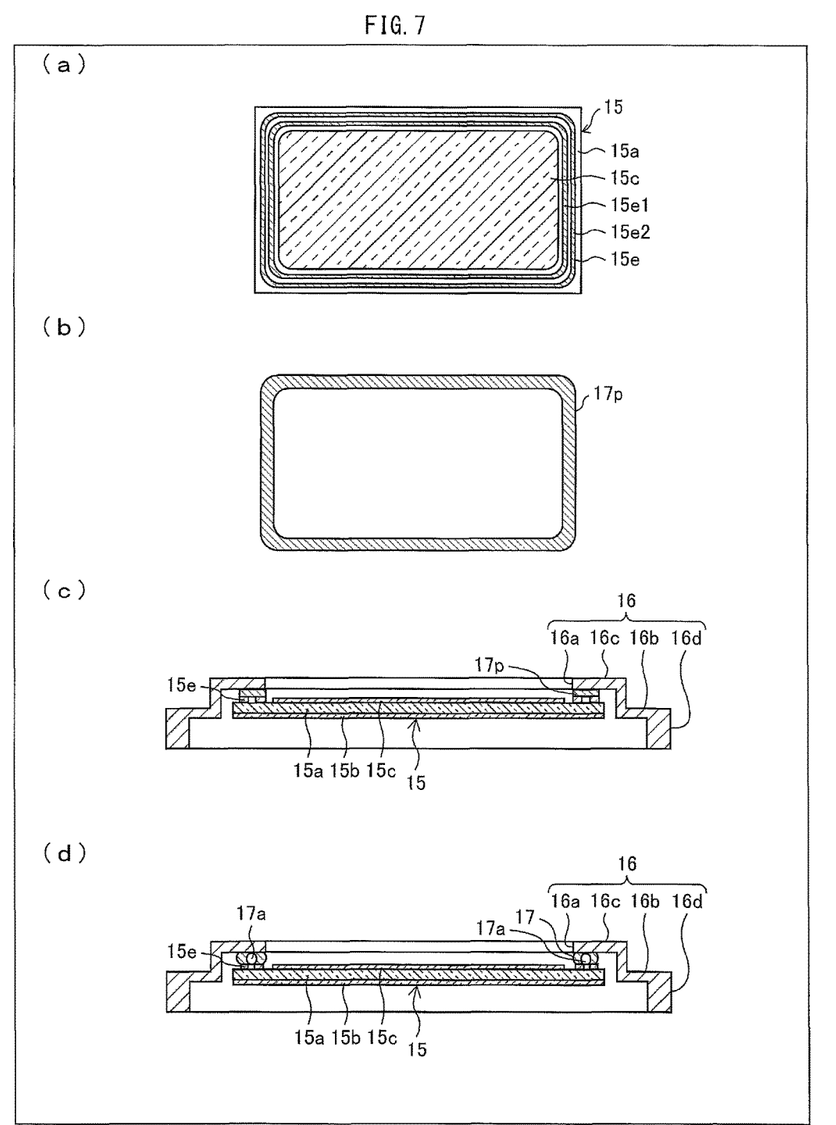

(a) of FIG. 7 is a plan view illustrating the window glass plate 15, illustrated in FIG. 4, which is used in a method of producing an optical device 1 in accordance with Embodiment 3. (b) of FIG. 7 is a plan view illustrating a solder frame 17p which is used to form the solder layer 17 illustrated in FIG. 4. (c) of FIG. 7 is a longitudinal sectional view illustrating how the solder frame 17p is provided between a lid section 16 and a window glass plate 15. (d) of FIG. 7 is a longitudinal sectional view illustrating how the lid section 16 and the window glass plate 15 are connected via a solder layer 17 formed from the solder frame 17p.

According to the method of producing the optical device 1 in accordance with Embodiment 3, the window glass plate 15 includes a metal coating film 15e (see (a) of FIG. 7), instead of the metal coating film 15d (see (a) of FIG. 5). The metal coating film 15e is made up of an inner peripheral metal coating film 15e1 and an outer peripheral metal coating film 15e2, each of which has an annular shape. The inner peripheral metal coating film 15e1 and the outer peripheral metal coating film 15e2 are obtained by forming a slit in a frame part of the metal coating film 15d in its center in a width direction so that the metal coating film 15d is separated into an inner peripheral part and an outer peripheral part that are independent of each other.

According to the method in accordance with Embodiment 3, (i) the window glass plate 15 has the metal coating film 15e and (ii) a light-translucent base material (glass) 15a is exposed between the inner peripheral metal coating film 15e1 and the outer peripheral metal coating film 15e2 of the metal coating film 15e. This prevents the light-translucent base material 15a from getting wet with solder. The void 17a is therefore easy to be formed in the solder layer 17 in a case where the solder frame 17p, provided between the metal coating film 15e of the window glass plate 15 and the lid section 16, is melted to form the solder layer 17 (see (c) and (d) of FIG. 7) in the step of connecting the lid section 16 and the window glass plate 15. It is therefore possible to easily and securely form the void 17a in the solder layer 17.

The other configurations with regard to the method of producing the optical device 1, configurations of the optical device 1 produced by the method, and advantages of the optical device 1 are similar to those discussed in Embodiment 1 with reference to FIGS. 1 through 5.

(Possible Configuration of Solder Layer 17)

Figure 8:
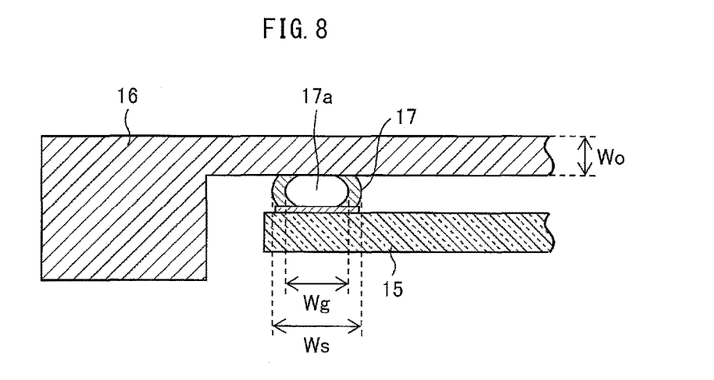
FIG. 8 is an enlarged view illustrating a main part of a configuration of the solder layer illustrated in FIG. 4.

The following description will discuss a possible configuration of the solder layer 17. FIG. 8 is an enlarged view illustrating a main part of the optical device 1 illustrating this possible configuration of the solder layer 17. In a case where the solder layer 17 has a thermal resistance smaller than those of the other members constituting a housing of the optical device 1, the housing of the optical device 1 has a smaller thermal insulation property because the solder layer 17 serves as a heat-flowing path. Such a reduction in thermal insulation property can be avoided, by sufficiently expanding a width of the void 17a in the solder layer 17 so that the solder layer 17 has a thermal resistance equal to or greater than those of the other members constituting the housing of the optical device 1.

The thermal resistance of the solder layer 17 can be expressed by $(Ws-Wg)/ms+Wg/mg$, where $Ws$[m] denotes a width of the solder layer 17, $ms$[W/m·K] denotes a thermal conductivity of the solder of which the solder layer 17 is made, $Wg$[m] denotes a width of the void 17a, and $mg$[W/m·K] denotes a thermal conductivity of a gas with which the void 17a is filled. The thermal resistance of each of the other members can be expressed by $Wo/mo$ where $Wo$[m] denotes a thickness of a corresponding one of the other members and $mo$[W/m·K] denotes a thermal conductivity of a corresponding one of the other members. A reduction in thermal insulation property due to the solder layer 17 can be therefore avoided, by setting the width $Wg$ of the void 17a so that it satisfies $(Ws-Wg)/ms+Wg/mg \geq Wo/mo$.

The solder layer 17 can have a thermal resistance equal to or greater than that of the lid section 16, which is made of Kovar (thermal conductivity: 17 W/m·K) and has a thickness of 0.3 mm, in a case where, for example, (i) the solder layer 17 is made of Au—Sn (thermal conductivity: 57 W/m·K), (ii) the width Ws of the solder layer 17 is set to 0.3 mm, (iii) the void 17a is filled with nitrogen (thermal conductivity: 0.026 W/m·K), and (iv) the width Wg of the void 17a is set to be equal to or greater than 0.32 μm.

The solder layer 17 can have a thermal resistance equal to or greater than that of the lid section 16, which is made of Kovar (thermal conductivity: 17 W/m·K) and has a thickness of 0.3 mm), in a case where, for example, (i) the solder layer 17 is made of Au—Sn (thermal conductivity: 57 W/m), (ii) the width Ws of the solder layer 17 is set to 1.0 mm, (iii) the void 17a is filled with nitrogen (thermal conductivity: 0.026 W/m·K), and (iv) the width Wg of the void 17a is set to be equal to or greater than 0.01 μm.

An optical device in accordance with an aspect of one or more embodiments of the present invention includes: a housing section configured to have a window; an optical element which is provided in the housing section and which light enters via the window; a window glass plate with which the window is provided; and a connecting section configured to connect the window glass plate to the housing section so that an internal space of the housing section is hermetically sealed, the connecting section being formed of a solder layer, the solder layer having therein a void which is isolated from an external space and the internal space of the optical device.

According to the above configuration, the window glass plate with which the window is provided is connected to the housing section via the solder layer, which is a connecting section, so that the internal space of the housing section is hermetically sealed. This makes it possible to (i) prevent moisture contained in outside air from coming into the optical device from a space between the housing section and the window glass plate and (ii) protect the optical element while maintaining high airtightness.

Furthermore, the solder layer has therein the void which is isolated from the external space and the internal space of the optical device. The void moderates the high thermal conductivity of the solder layer. This makes it difficult for a change in temperature of the external space to be conducted to the optical element included in the optical device. Consequently, the optical element is hard to change its characteristic in response to such a change in temperature of the external space. As such, the optical device is hard to be affected by a change in external environment. The optical device can therefore operate continuously and stably.

The above optical device can be configured such that a ratio of a volume of the void to a volume of the solder layer falls within the range of 1/4 to 1/2.

According to the above configuration, the ratio of the volume of the void to the volume of the solder layer falls within the range of 1/4 to 1/2. With this configuration of the void, the solder layer secures a possible thermal insulation property.

The above optical device can be configured such that the void of the solder layer has a width which is set so that the solder layer has a thermal resistance equal to or greater than a thermal resistance of the housing section or the window glass plate.

According to the above configuration, the void of the solder layer has a width which is set so that the solder layer has a thermal resistance equal to or greater than that of the housing section or the window glass plate. It is therefore possible to securely prevent such a situation where a change in temperature of the external space is easy to be conducted, due to the solder layer, to the optical element provided in the optical device.

The above optical device can be configured such that the window glass plate has a metal coating film on a side where the solder layer is provided; the metal coating film is made up of an inner peripheral metal coating film and an outer peripheral metal coating film each of which has an annular shape, the outer peripheral metal coating film being provided on an outer side of the inner peripheral metal coating film; and the window glass plate is exposed between the inner peripheral metal coating film and the outer peripheral metal coating film.

According to the above configuration, the metal coating film, which is provided on the side of the window glass plate on which side the solder layer is provided, is made up of the inner peripheral metal coating film and the outer peripheral metal coating film each of which has an annular shape, and the window glass plate is exposed between the inner peripheral metal coating film and the outer peripheral metal coating film.

Therefore, in the step of connecting the window glass plate to the housing section via the solder layer during production of the optical device, a part of the window glass plate which part is exposed between the inner peripheral metal coating film and the outer peripheral metal coating film is prevented from getting wet with melted solder. This makes it possible to easily and securely form the void in the solder layer.

A method of producing an optical device in accordance with an aspect of one or more embodiments of the present invention includes the steps of: preparing (i) a first housing section having a window, (ii) a window glass plate, (iii) an optical element, and (iv) a second housing section in which the optical element is to be fixed so that light enters the optical element via the window; connecting the window glass plate to the window of the first housing section via a solder layer so as to (i) hermetically seal a space between the window glass plate and the first housing section and (ii) form, in the solder layer, a void which is isolated from an external space and an internal space of the optical device; and connecting (i) the first housing section to which the window glass plate is connected and (ii) the second housing section in which the optical element is fixed so that an internal space of the first housing section and the second housing section is hermetically sealed.

According to the above configuration, a space between the window glass plate and the first housing section is hermetically sealed by the solder layer. This hermetically seals the internal space of the first housing section and the second housing section. At the same time, a void is formed in the solder layer which void is isolated from the external space and the internal space of the optical device.

This makes it possible to (i) prevent moisture contained in outside air from coming into the optical device from the space between the first housing section and the window glass plate and (ii) protect the optical element while maintaining high airtightness. Furthermore, the void moderates the high thermal conductivity of the solder layer. This makes it difficult for a change in temperature of the external space to be conducted to the optical element included in the optical device. Consequently, the optical element is hard to change its characteristic in response to a change in external environment. The optical device can therefore operate continuously and stably.

The above method can be configured such that a metal coating film is formed on a side of the window glass plate on which side the solder layer is to be provided; and the metal coating film is made up of an inner peripheral metal coating film and an outer peripheral metal coating film each of which has an annular shape, the outer peripheral metal coating film being formed on an outer side of the inner peripheral metal coating film; and the window glass plate is exposed between the inner peripheral metal coating film and the outer peripheral metal coating film.

According to the above configuration, the metal coating film, which is provided on a side of the window glass plate on which side the solder layer is provided, is made up of the inner peripheral metal coating film and the outer peripheral metal coating film, each of which has an annular shape, and the window glass plate is exposed between the inner peripheral metal coating film and the outer peripheral metal coating film.

Therefore, in the step of connecting the window glass plate to the window of the first housing section via the solder layer so as to form the void in the solder layer, a part of the window glass plate which part is exposed between the inner peripheral metal coating film and the outer peripheral metal coating film is prevented from getting wet with melted solder. This makes it possible to easily and securely form a void in the solder layer.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

INDUSTRIAL APPLICABILITY

One or more embodiments of the present invention may be used as a switch for switching an optical path of light.

REFERENCE SIGNS LIST

1: Optical device
11: Ceramic substrate (housing section, second housing section)
12: Optical element
13: Heater
15: Window glass plate
15a: Light-translucent base material
15b: Anti-reflection film
15c: Anti-reflection film
15d: Metal coating film
15e: Metal coating film
15e1: Inner peripheral metal coating film 15e2: Outer peripheral metal coating film
16: Lid section (housing section, first housing section)
16a: Window
16b: Outer peripheral part
16c: Protruding part
17: Solder layer
17a: Void
17p: Solder frame
17q: Solder frame

The invention claimed is:

1. An optical device, comprising:
a housing that has a window;
an optical element which is provided in the housing and which light enters via the window;
a window glass plate with which the window is provided; and
a connector that connects the window glass plate to the housing so that an internal space of the housing is hermetically sealed,
the connector being formed of a solder layer,
the solder layer having therein a void which is isolated from an external space and an internal space of the optical device, the solder layer completely surrounding the void.

2. The optical device as set forth in claim 1, wherein:
a ratio of a first volume of the void to a second volume of the solder layer falls within the range of 1/4 to 1/2.

3. The optical device as set forth in claim 1, wherein:
the void of the solder layer has a width which is set so that the solder layer has a thermal resistance equal to or greater than a thermal resistance of the housing or the window glass plate.

4. The optical device as set forth in claim 1, wherein:
the window glass plate has a metal coating film on a side where the solder layer is provided;
the metal coating film is made up of an inner peripheral metal coating film and an outer peripheral metal coating film each of which has an annular shape, the outer peripheral metal coating film being provided on an outer side of the inner peripheral metal coating film; and
the window glass plate is exposed between the inner peripheral metal coating film and the outer peripheral metal coating film.

5. A method of producing an optical device, comprising the steps of:
preparing (i) a first housing having a window, (ii) a window glass plate, (iii) an optical element, and (iv) a second housing in which the optical element is to be fixed so that light enters the optical element via the window;
connecting the window glass plate to the window of the first housing via a solder layer so as to (i) hermetically seal a space between the window glass plate and the first housing and (ii) form, in the solder layer, a void which is isolated from an external space and an internal space of the optical device, the solder layer completely surrounding the void; and
connecting (i) the first housing to which the window glass plate is connected and (ii) the second housing in which the optical element is fixed so that an internal space of the first housing and the second housing is hermetically sealed.

6. The method as set forth in claim 5, wherein:
a metal coating film is formed on a side of the window glass plate on which side the solder layer is to be provided; and
the metal coating film is made up of an inner peripheral metal coating film and an outer peripheral metal coating film each of which has an annular shape, the outer peripheral metal coating film being formed on an outer side of the inner peripheral metal coating film; and
the window glass plate is exposed between the inner peripheral metal coating film and the outer peripheral metal coating film.

7. An optical device, comprising:
a housing that has a window;
an optical element which is provided in the housing and which light enters via the window;
a window glass plate with which the window is provided; and
a connector that connects the window glass plate to the housing so that an internal space of the housing is hermetically sealed,
the connector being formed of a solder layer,
the solder layer having therein a void which is isolated from an external space and an internal space of the optical device,
wherein a ratio of a first volume of the void to a second volume of the solder layer falls within the range of 1/4 to 1/2.

* * * * *